United States Patent [19]
Binder

[11] Patent Number: 6,016,113
[45] Date of Patent: Jan. 18, 2000

[54] SYSTEM FOR ENHANCING THE ACCURACY OF ANALOG-DIGITAL-ANALOG CONVERSIONS

[76] Inventor: Yehuda Binder, 30/8 Yeshurun Street, Hod Hasharon 45200, Israel

[21] Appl. No.: 08/882,826

[22] Filed: Jun. 26, 1997

[51] Int. Cl.[7] .................................................. H03M 1/20
[52] U.S. Cl. ............................................ 341/131; 341/120
[58] Field of Search ........................................ 341/118, 120, 341/119, 110, 122, 131

[56] References Cited

U.S. PATENT DOCUMENTS

| | | |
|---|---|---|
| 3,656,152 | 4/1972 | Gundersen . |
| 4,144,577 | 3/1979 | Ley . |
| 4,187,466 | 2/1980 | Kasson et al. . |
| 4,219,880 | 8/1980 | Nichols . |
| 4,225,936 | 9/1980 | Lesche . |
| 4,308,585 | 12/1981 | Jordan . |
| 4,667,302 | 5/1987 | Mackey et al. . |
| 4,700,173 | 10/1987 | Araki et al. . |
| 4,746,879 | 5/1988 | Ma et al. . |
| 4,800,364 | 1/1989 | Mortara . |
| 4,914,439 | 4/1990 | Nakahashi et al. . |
| 4,963,881 | 10/1990 | Franceschini . |
| 4,994,803 | 2/1991 | Blackham . |
| 5,006,850 | 4/1991 | Murphy . |
| 5,187,481 | 2/1993 | Hiller . |
| 5,189,418 | 2/1993 | Bartz et al. . |
| 5,204,975 | 4/1993 | Shigemori . |
| 5,305,005 | 4/1994 | Nakagawa et al. . |
| 5,396,241 | 3/1995 | Ames et al. . |
| 5,416,481 | 5/1995 | Chen . |
| 5,451,947 | 9/1995 | Morrison . |
| 5,459,436 | 10/1995 | Pucci et al. . |
| 5,576,709 | 11/1996 | Onaya et al. . |
| 5,815,102 | 9/1998 | Melanson ................................ 341/143 |
| 5,821,889 | 10/1998 | Miller ..................................... 341/139 |

OTHER PUBLICATIONS

Yamasaki; Application of Large Amplitude Dither to the Quantization of Wide Range Audio Signals; Waseda University, Dept. of Science; pp. 1–24, Sep. 1982.

*Primary Examiner*—Michael Tokar
*Assistant Examiner*—Peguy JeanPierre
*Attorney, Agent, or Firm*—Darby & Darby

[57] ABSTRACT

An apparatus for and method of enhancing the accuracy of analog-digital-analog conversions achieves improved accuracy by generating a dither signal which is combined with an input analog signal before the analog input signal is converted to digital form. The combined input analog/dither signal is then converted to digital. The digital signal is then processed or delayed in accordance with the desired function to be performed by the circuit. After digital processing, the digital values are converted back into analog form and the dither signal subsequently removed from the output signal. In addition, an apparatus for and method of enhancing the accuracy of analog-digital-analog conversions that does not utilize an explicit dither signal, utilizes linear interpolation techniques to achieve the effect of a pseudo dither signal. Similarly, time multiplexing techniques are also used to achieve the same effect. The principles of the present invention are applicable in systems that generate analog signals using consecutive digital samples. The resultant output signals from such systems exhibit improved accuracy, lower distortion and higher resolution. The present invention can also be utilized to maintain the original output resolution while requiring fewer bits to represent the digital samples.

35 Claims, 13 Drawing Sheets

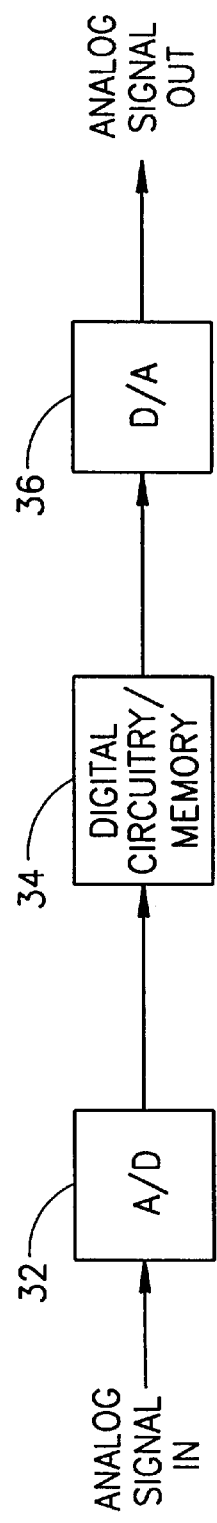
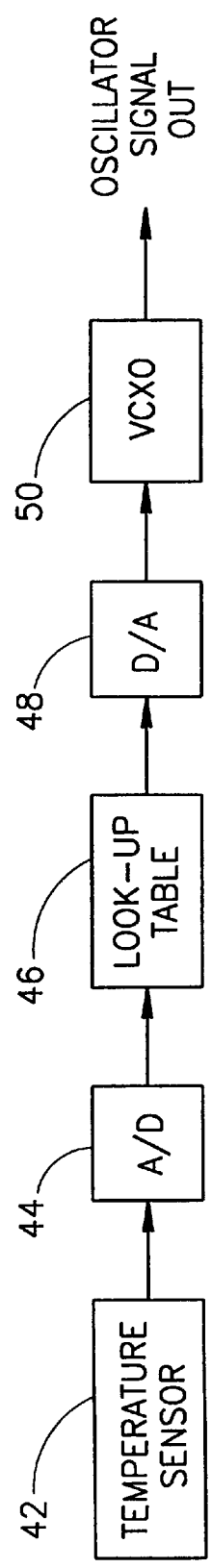
FIG. 6
PRIOR ART
FIG. 7
PRIOR ART

SYSTEM FOR ENHANCING THE ACCURACY OF ANALOG-DIGITAL-ANALOG CONVERSIONS

FIELD OF THE INVENTION

The present invention relates generally to systems for performing analog-digital-analog (A/D/A) conversion and more particularly relates to a system that utilizes dithering, interpolation or averaging to improve the performance of such conversions.

BACKGROUND OF THE INVENTION

Dithering, also known as quantization error dispersion (QED), is a well known signal processing technique for improving the accuracy and resolution of analog to digital conversions. In general, the technique involves adding a dither signal to an analog signal prior to its conversion to a digital value in order to enhance the resolution of a particular A/D converter. After conversion, the dither signal is removed from the output of the conversion. The dither signal itself can be random white noise, a periodic ramp, square wave or triangle wave sweep, for example.

An analog to digital converter is limited in resolution according to the spacing between quantization levels. To illustrate, for a particular A/D converter, an analog signal falling between two adjacent quantization levels of the converter will always be converted to the lower digital value. Therefore, a quantization error is introduced into the output signal as different analog values falling within this interval generate the same digital value.

One solution is to increase the number of quantization levels but this solution is complicated and costly to implement. In addition, the digital conversion of signals having high dynamic range may be necessary and variations of low magnitude signals may generate the same digital value, i.e., lie between two quantization levels of the converter.

The addition of a dither signal, such as random white noise or a swept ramp function, to the input analog signal prior to digital conversion provides one way of compensating for these quantization errors. To illustrate, consider the case of an analog signal having a magnitude exactly half a quantization level. If no dither signal is applied, the converter will always output the lower digital value. If, however, a ramp signal having a magnitude of one quantization level is added to the input analog signal prior to conversion, the magnitude of the combined signal will remain below the threshold for half the time. As the ramp signal rises, the magnitude of the combined signal will rise above the next threshold for the other half of the time such that the converter will output the digital representation of the lower quantization level for half the time and the digital representation of the upper quantization level for the other half of the time. Digitally averaging the output of the converter over the ramp time yields a value corresponding to the average of the two quantization levels, which is the actual value of the input analog signal.

To further illustrate the technique of dithering, consider the case where the input analog signal is at a magnitude 10% above a particular quantization level, as opposed to 50% or half in the previous example. As the ramp dither signal is swept from low to high, the converter will output the digital value corresponding to the lower quantization level for the first 90% of the time and will output the digital value corresponding to the upper quantization level for the last 10% of the time. The average of the two digital outputs is the actual value of the analog input.

Numerous applications employ signal processing techniques that utilize dithering. Many of the applications that utilize dithering involve either choosing a particular dither signal and/or its method of injection into the input signal.

U.S. Pat. No. 5,189,418, issued to Bartz et al., teaches a technique for correcting in a dithered A/D conversion circuit. The dither signal is added to the analog input signal and then converted. The dither signal is removed by subtracting the digital dither value from the converted signal. A correction signal is also generated and subtracted from the analog input signal.

U.S. Pat. No. 5,187,481, issued to Hiller, teaches a circuit for A/D conversion whereby a dither signal is introduced before conversion and subtracted out of the resulting digital output. Gain control feedback loops are utilized to reduce gain error of the dither signal. The invention derives gain control feedback by performing correlation between the digital output and the dither signal.

U.S. Pat. No. 4,914,439, issued to Nakahashi et al., teaches a conversion system for digitizing an analog signal which adds a dither signal to the analog signal. After conversion of the combined signal, the dither signal is digitally subtracted from the converted signal. The dither signal is generated digitally and converted to analog by a D/A converter before being added to the input analog signal.

U.S. Pat. No. 5,451,947, issued to Morrison, discloses a system for A/D conversion which utilizes a dither signal that is modulated by another signal. The dither signal is modulated such that it is varied over at least one quantization interval of the A/D converter.

U.S. Pat. No. 5,416,481, issued to Chen, discloses a sigma-delta A/D converter that incorporates a dither circuit within the A/D converter package. The dither signal is added to the analog input signal so as to reduce the effects of quantization noise produced as a result of DC offset voltage in the analog signals.

U.S. Pat. No. 4,963,881, issued to Franceschini, teaches a method and apparatus for enhancing the resolution of an A/D converter. An analog dither signal is added to the input signal to be converted. Integration of the composite digital signal causes the effects of the dither signal to average to zero. The integration is performed using digital signal processing techniques to implement a DSPN correlator.

U.S. Pat. No. 4,700,173, issued to Araki et al., teaches using time division multiplexing techniques to multiplex an analog dither signal with a combined signal consisting of an analog dither signal added to the input signal. A single A/D converter is utilized to convert both the dither signal by itself and the dither signal combined with the input. The dither signal is then digitally subtracted from the converted signal.

Each of the references discussed above involve applying a dither signal to an analog to digital conversion system. In these devices, the dither signal is added to the analog input before conversion. Subsequent to conversion, the dither signal is digitally removed from the converted output signal thus reducing the effects of noise and distortion. Applications of the dithering technique include use in pulse code modulation (PCM) systems and compact disk players and other audio applications to reduce the distortion caused by quantization error noise. The dither signal is added to the analog input signal so as to turn the noise resulting from quantization errors into white noise which hardly effects the perceived quality of the reproduced sound.

A high level block diagram illustrating a prior art A/D conversion circuit where a dither signal is added to the analog input signal is shown in FIG. 1. The conversion circuit, generally referenced 12, comprises an adder or summer 14, A/D converter 16, dither signal generator 20 and a dither signal removal 18. The analog dither signal is added to the analog input signal before conversion to digital form. The combined signal is then converted via A/D converter 16 and the dither signal removed digitally to produce a digital output signal. As described in detail above, the addition of the dither signal to the input functions to improve the accuracy of the analog to digital conversion.

U.S. Pat. No. 4,994,803, issued to Blackham, teaches adding a digital pseudo random number dither signal to a digital input signal. The combined digital signal is then converted to analog, along with the dither signal. The analog counterpart of the digital random number dither signal is then subtracted from the analog output of the D/A converter. The introduction of the dither signal functions to reduce distortion and improve linearity.

In addition, U.S. Pat. No. 3,656,152, issued to Gundersen and U.S. Pat. No. 4,187,466, issued to Kasson et al., both teach conversion circuits that add an analog dither signal to an analog input signal before A/D conversion in addition to performing analog removal of the dither signal.

SUMMARY OF THE INVENTION

In a typical A/D/A circuit, system inaccuracies are inherently induced due to the finite resolution and accuracy of the A/D and the D/A converters. The present invention enhances system accuracy by weighting 'neighboring' output values in accordance with their 'distance' from the current original output value, thus creating artificial output levels.

Similarly, in the case of converting successive digital values to analog, prior art circuits output a single value each clock period. The present invention functions to enhance the accuracy of these conversions by utilizing, during each clock period, the current value as well as 'neighboring' values in conjunction with an interpolation method such that additional output levels are created.

More particularly, the present invention is an apparatus for and method of enhancing the accuracy of analog-digital-analog conversions. Improved accuracy is achieved by generating a dither signal which is combined with an input analog signal before conversion to digital form. The combined input analog/dither signal is then converted to digital. The digital signal is then processed in accordance with the desired function to be performed by the circuit. After digital processing, the digital values are converted back into analog form and the dither signal subsequently removed from the output signal.

In addition, the present invention discloses an apparatus for and method of enhancing the accuracy of digital to analog conversions that does not utilize an explicit dither signal but rather utilizes linear interpolation techniques to achieve the effect of a pseudo dither signal. Similarly, time multiplexing techniques can also be used to achieve the same effect. The principles of the present invention are applicable in any system that processes analog signals using consecutive digital samples. The resultant output signals from such systems exhibit improved accuracy, lower distortion and higher resolution.

There is therefore provided in accordance with the present invention a method of analog-digital-analog conversion of an input analog signal into an output analog signal, the method comprising the steps of generating an analog dither signal, combining the analog dither signal with the input analog signal to generate a first combined analog signal, converting the first combined signal into a first digital signal, processing the first digital signal into a second digital signal, converting the second digital signal into a second combined analog signal, and removing the analog dither signal component from the second combined analog signal to yield the output analog signal.

The step of generating an analog dither signal may comprise the step of generating an analog staircase waveform, a saw-tooth waveform, a modulated signal waveform, a pseudo random or white noise waveform, a ramp waveform or a square wave waveform. The step of processing comprises the step of implementing a predetermined function.

There is also provided in accordance with the present invention an apparatus for performing analog-digital-analog conversion of an input analog signal into an output analog signal, the apparatus comprising an analog dither signal generator, means for combining the analog dither signal with the analog input signal to generate a first combined analog signal, first conversion means for converting the first combined signal into a first digital signal, processing means for transforming the first digital signal into a second digital signal, second conversion means for converting the second digital signal into a second combined analog signal, and means for removing the analog dither signal component from the second combined analog signal to yield the output analog signal.

In addition, there is provided in accordance with the present invention a method of generating a control signal input to an analog controlled oscillator, the method comprising the steps of providing temperature measurement means for outputting a temperature output signal, generating an analog dither signal, combining the temperature output signal with the analog dither signal to generate a first combined analog signal, converting the first combined signal into a first digital signal, processing the first digital signal into a second digital signal, converting the second digital signal into a second combined analog signal, and removing the analog dither signal from the second combined analog signal to yield the control signal input to the oscillator. The step of processing comprises the step of providing and utilizing a look-up table memory.

Further, there is provided in accordance with the present invention an apparatus for generating a control signal input to a temperature compensated oscillator, comprising temperature measurement means for outputting a temperature output signal, an analog dither signal generator, means for combining the temperature output signal with the analog dither signal to generate a first combined analog signal, first conversion means for converting the first combined signal into a first digital signal, processing means for transforming the first digital signal into a second digital signal, second conversion means for converting the second digital signal into a second combined analog signal, and means for removing the analog dither signal from the second combined analog signal to yield the control signal input to the oscillator.

Also, there is provided in accordance with the present invention a method of delaying an input analog signal to generate an output analog signal, the method comprising the steps of generating an analog dither signal, combining the analog dither signal with the input analog signal to generate a first combined analog signal, converting the first combined signal into a digital signal, delaying the delayed digital signal, converting the delayed digital signal into a second combined analog signal, and removing the analog dither signal from the second combined analog signal to yield the output analog signal.

Further, there is provided in accordance with the present invention an apparatus for delaying an input analog signal to generate an output analog signal, comprising an analog dither signal generator, means for combining the analog dither signal with the analog input signal to generate a first combined analog signal, first conversion means for converting the first combined analog signal into a digital signal, delay means for delaying the digital signal, second conversion means for converting the delayed digital signal into a second combined analog signal, and means for removing the analog dither signal component from the second combined analog signal to yield the output analog signal.

There is also provided in accordance with the present invention a method of delaying an input analog signal to generate an output analog signal, the method comprising the steps of converting the input analog signal into a digital signal, delaying the digital signal to yield at least a first delayed digital signal and a second delayed digital signal, the first digital signal delayed less in time than the second digital signal, processing the first delayed digital signal and the second delayed digital signal so as to generate a plurality of digital signals whose combination, after conversion to analog, is smoother and more accurate then the combination of the first delayed digital signal and the second delayed digital signal alone, and converting the plurality of digital signals into analog form to yield the output analog signal.

The step of processing comprises the step of linearly interpolating the first digital signal and the second digital signal to generate the plurality of digital signals. Alternatively, the step of processing comprises the step of time multiplexing the first digital signal and the second digital signal to generate the plurality of digital signals. Further, the method further comprises the step of applying low pass filter means to the output analog signal.

There is also provided in accordance with the present invention an apparatus for delaying an input analog signal to generate an output analog signal, comprising first conversion means for converting the first combined analog signal into a digital signal, delay means for delaying the digital signal so as to yield at least a first delayed digital signal and a second delayed digital signal, the first digital signal delayed less in time than the second digital signal, processing means for generating from the first digital signal and the second digital signal a plurality of digital signals whose combination, after conversion to analog, is smoother and more accurate then the combination of the first digital signal and the second digital signal alone, and second conversion means for converting the plurality of digital signals into analog form to yield the output analog signal.

The processing means comprises means for linearly interpolating the first digital signal and the second digital signal to generate the plurality of digital signals. The processing means comprises means for multiplexing the first digital signal and the second digital signal to generate the plurality of digital signals. Further, the apparatus further comprises means for low pass filtering the output analog signal.

There is further provided in accordance with the present invention a method of delaying an input analog signal to generate an output analog signal, the method comprising the steps of converting the input analog signal into a digital signal, delaying the digital signal to yield at least a first digital signal and a second digital signal, the first digital signal delayed less in time than the second digital signal, converting the first digital signal and the second digital signal into a first analog and a second analog signal, respectively, and processing the first analog signal and the second analog signal so as to generate the output analog signal which is smoother and more accurate then the first analog signal and the second analog signal alone.

Also, there is provided in accordance with the present invention an apparatus for delaying an input analog signal to generate an output analog signal, comprising first conversion means for converting the first combined analog signal into a digital signal, delay means for delaying the digital signal to yield at least a first delayed digital signal and a second delayed digital signal, the first digital signal delayed less in time than the second digital signal, second conversion means for converting the first digital signal and the second digital signal into a first analog and a second analog signal, respectively, and processing means for generating from the first analog signal and the second analog signal the output analog signal which is smoother and more accurate then the first analog signal and the second analog signal alone.

There is provided in accordance with the present invention a method of generating an output analog waveform signal, the method comprising the steps of generating a first sequence of digital numbers, incrementing the first sequence of digital numbers to yield a second sequence of digital numbers, multiplexing the first sequence of digital numbers and the second sequence of digital numbers to yield a multiplexer output signal, applying the multiplexer output signal to a processor to yield a digital output value, and converting the digital output value to analog form to yield the output analog waveform signal.

There is also provided in accordance with the present invention an apparatus for generating an output analog waveform signal, comprising means for generating a first sequence of digital numbers, means for incrementing the first sequence of digital numbers to yield a second sequence of digital numbers, multiplexer means for multiplexing the first sequence of digital numbers and the second sequence of digital numbers to yield a multiplexer output signal, memory means coupled to the multiplexer means, the memory means operative to yield a digital output value in accordance with the multiplexer output signal input thereto, conversion means for converting the digital output value to analog form to yield the output analog waveform signal.

In addition, there is provided in accordance with the present invention a method of generating an output analog waveform signal, the method comprising the steps of generating a sequence of digital numbers, applying the sequence of digital numbers to a processor to yield a first digital value, delaying the first digital value to yield a second digital value, processing the first digital value and the second digital value so as to generate a plurality of digital signals whose combination, after conversion to analog, is smoother and more accurate then the combination of the first digital value and the second digital value alone, and converting the plurality of digital signals into analog form to yield the output analog waveform signal.

There is also provided in accordance with the present invention an apparatus for generating an output analog waveform signal, comprising generating means for generating a sequence of digital numbers, memory means coupled to the generating means, the memory means operative to yield a first digital value in accordance with the sequence of digital numbers input thereto, delay means for delaying the first digital value to yield a second digital value, processing means for generating from the first digital value and the second digital value a plurality of digital signals whose combination, after conversion to analog, is smoother and more accurate then the combination of the first digital value and the second digital value alone, and conversion means for converting the plurality of digital signals into analog form to yield the output analog waveform signal.

There is also provided in accordance with the present invention a method of generating an output analog waveform signal, the method comprising the steps of generating a sequence of digital numbers, applying the sequence of digital numbers to a processor to yield a first digital value, delaying the first digital value to yield a second digital value, converting the first digital value and the second digital value to analog form to yield a first analog value and a second analog value, respectively, and processing the first analog value and the second analog value so as to generate an output analog signal which is smoother and more accurate then the combination of the first analog value and the second analog value alone.

Further, there is provided in accordance with the present invention a method of generating an output analog waveform signal, the method comprising the steps of generating means for generating a sequence of digital numbers, memory means coupled to the generating means, the memory means operative to yield a first digital value in accordance with the sequence of digital numbers input thereto, delay means for delaying the first digital value to yield a second digital value, conversion means for converting the first digital value and the second digital value to analog form to yield a first analog value and a second analog value, respectively, and processing means for generating from the first analog value and the second analog value an output analog signal which is smoother and more accurate then the combination of the first analog value and the second analog value alone.

BRIEF DESCRIPTION OF THE DRAWINGS

The invention is herein described, by way of example only, with reference to the accompanying drawings, wherein:

FIG. 6 is a high level block diagram illustrating a prior art function transformer circuit employing A/D and D/A conversions;

FIG. 7 is a high level block diagram illustrating a prior art digital temperature compensated crystal oscillator (DTCXO) circuit;

DETAILED DESCRIPTION OF THE INVENTION

In one embodiment of the present invention, the dither signal is combined with an analog input signal. The resulting combination of input and dither signal is then converted via an A/D converter and processed as desired. After processing, the output digital signal is converted to analog using a D/A converter. The dither signal is then removed from the analog output of the D/A converter using analog means. This process yields a smooth output analog signal having low distortion. The analog output signal is more accurate in that the addition of the dither signal to the input and its subsequent removal therefrom results in a higher overall accuracy for the analog-digital-analog conversion process.

Figure 1:
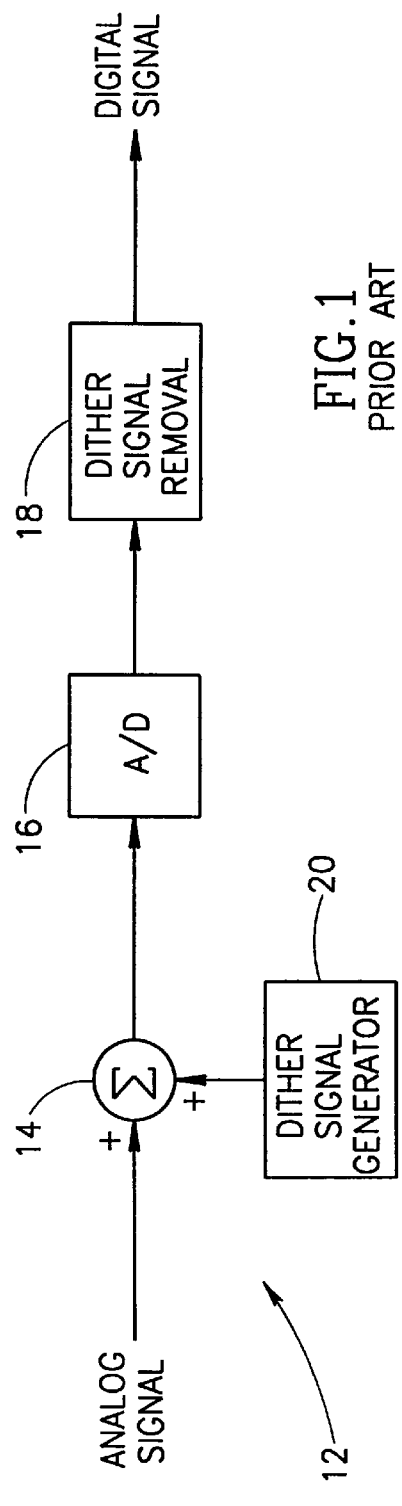
FIG. 1 is a high level block diagram illustrating a prior art A/D conversion circuit where a dither signal is added to the analog input signal.
Figure 2:
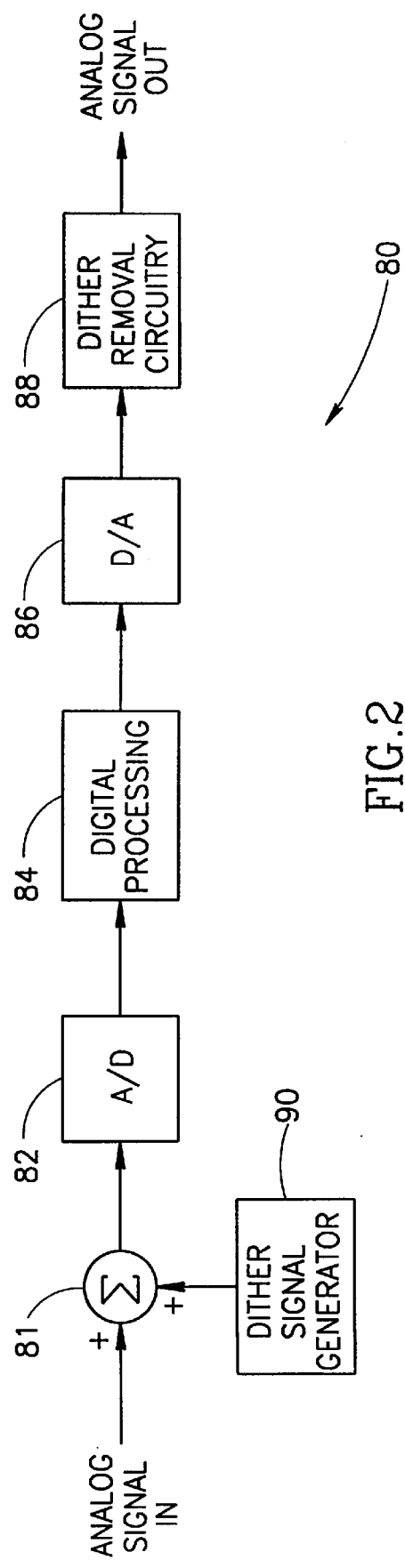
FIG. 2 is a high level block diagram illustrating an A/D/A conversion circuit constructed in accordance with a first embodiment of the present invention.

A high level block diagram illustrating an A/D/A conversion circuit constructed in accordance with a first embodiment of the present invention is shown in FIG. 2. The analog-digital-analog conversion circuit, generally referenced 80, comprises an analog summer or adder 81, dither signal generator 90, A/D converter 82, digital processing unit 84, D/A converter 86 and dither removal circuitry 88.

Throughout this document the following terms are intended to be used interchangeably: digital processing, hardware, hardware means, memory, memory means, digital signal processing (DSP) means, transmission facility means, hardware/software means, look-up table means or any other type of digital to digital conversion mechanism.

The analog input signal is summed with the dither signal generated by the dither signal generator 90 via summer 81. The addition of the dither signal, which may be, for example, random white noise, square wave, triangle wave, swept ramp function, to the input analog signal is operative to increase the effective resolution of the A/D converter. For example, if random white noise is used as the dither signal, the addition of the dither signal to the input signal causes the quantization noise inherent in the A/D converter to appear in the converted digital output and subsequent analog output as random noise which is far less perceptible and which can be easily removed using low pass filtering.

Similarly, as described previously, use of a swept ramp function whose magnitude spans one quantization level, is effective to increase the resolution of the digital output of the A/D converter by linearly interpolating the input analog signal. Depending on where in the quantization level the input analog signal lies, the output of the A/D converter will switch output values in accordance thereto.

The tradeoff of obtaining increased resolution by using this technique of adding a dither signal to the input is that the frequency of the system must be increased in order to accommodate the faster processing and A/D and D/A conversion times. If the frequency of conversions of the system prior to the addition of a dither signal was, for example, F, then the resultant frequency of conversion after addition of the dither signal may be 10 F to 50 F or more. The frequency increase is dependent on the desired improvement in signal accuracy. Alternatively, the accuracy of the original system can be maintained with a consequent reduction in the number of bits or signal lines needed to represent the digital samples.

In the circuit of FIG. 2, it is noted that the dither signal generated by the dither signal generator 90 preferably has zero average value, but is not a requirement. The removal of the dither signal by the dither removal circuitry 88 may be performed using a low pass filter (LPF) such as an RC low pass filter.

It is important to note that the summer and the dither signal removal are constructed in accordance with the type of dither signal being used in the system. For example, if a dither signal having a zero average value is utilized, the dither signal removal circuitry can comprise a low pass filter.

As described above, many different types of signals may be suitable for use as the dither signal. A dither signal comprising a staircase waveform may be utilized and is described in more detail in U.S. Pat. No. 4,144,577. A dither signal comprising a saw-tooth or triangle waveform may be utilized and is described in more detail in U.S. Pat. No. 5,305,005. A dither signal comprising a modulated signal may be utilized and is described in more detail in U.S. Pat. No. 5,451,947. A dither signal comprising a pseudo random noise waveform may be utilized and is described in more detail in U.S. Pat. Nos. 5,187,418 and 5,189,418. A dither signal comprising a ramp waveform that is created digitally may be utilized and is described in more detail in U.S. Pat. No. 4,800,364. A dither signal comprising a square wave waveform may be utilized and is described in more detail in U.S. Pat. No. 3,656,152.

Other types of dither signals not mentioned above may also be utilized which are effective at achieving the desired improvement in conversion accuracy. The combining of the dither signal with the input signal may be performed by other then a summer or adder. Described in U.S. Pat. No. 5,305,005 is a dither circuit that utilizes an RC network to combine the dither signal with the input. Alternatively, the dither signal can be combined with the input signal within the A/D converter itself as described in U.S. Pat. No. 5,416,481.

Figure 3:
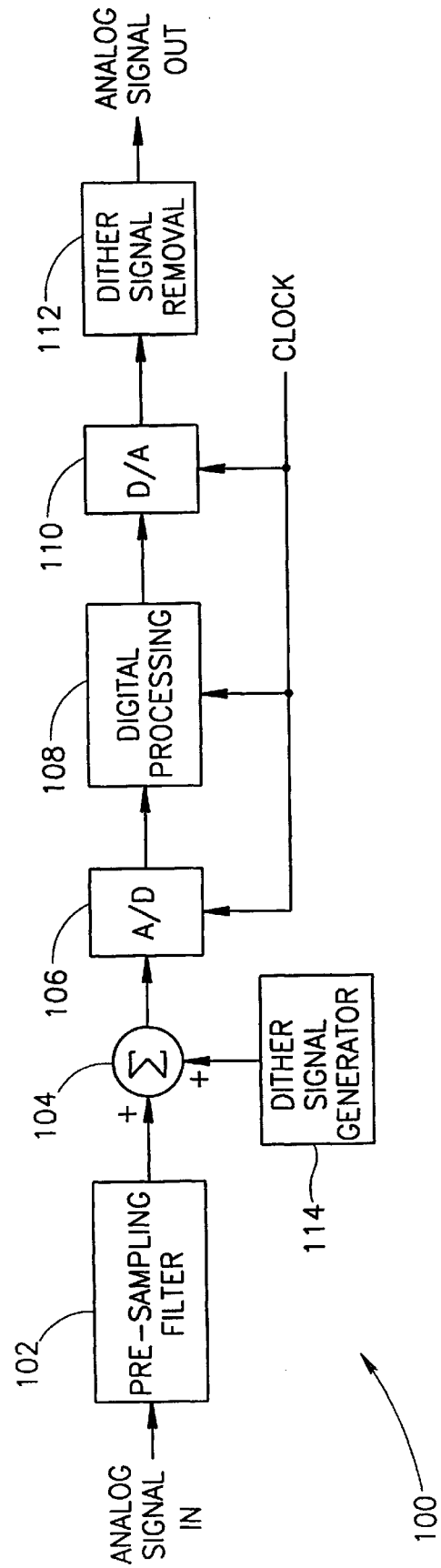
FIG. 3 is a high level block diagram illustrating in more detail the A/D/A conversion circuit constructed in accordance with a first embodiment of the present invention.

A high level block diagram illustrating in more detail the A/D/A conversion circuit constructed in accordance with a first embodiment of the present invention is shown in FIG. 3. The conversion circuit, generally referenced 100, comprises a pre-sampling filter 102, summer or adder 104, dither signal generator 114, A/D converter 106, digital processing means 108, D/A converter 110 and post sampling filter 112. The pre-sampling filter functions to remove unwanted frequency components from the input signal before conversion. The post sampling filter functions to remove the effects of the dither signal injection. Typically, the post sampling filter comprises a low pass filter.

Figure 4:
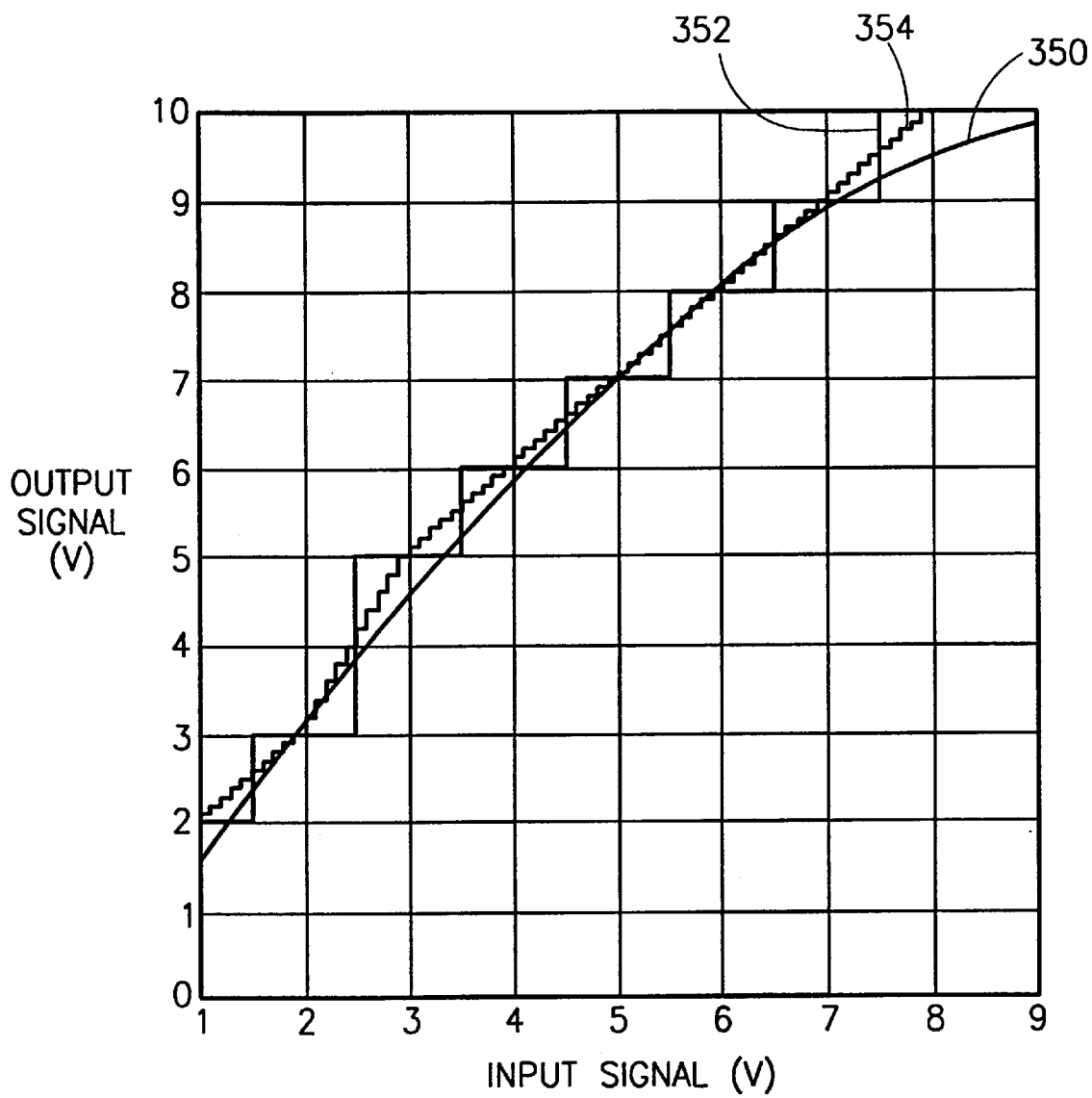
FIG. 4 is a graph illustrating an example continuous analog output signal, the output signal generated by the A/D/A circuit of the prior art and that generated by the A/D/A circuit of the present invention.

To aid in understanding the principles of the present invention, an example function that is input to both the prior art circuit and the circuit of the present invention will now be presented. A graph illustrating an example input/output curve for the A/D/A circuit of the prior art and that of the A/D/A circuit of the present invention is shown in FIG. 4. The curve labeled with reference numeral 350 represents the ideal analog output of an example sinusoidal curve. An expression for the curve 350 is given by:

$$f(x) = 10\sin\left(\frac{x}{10} \cdot \frac{\pi}{2}\right)$$

where $f(x)$ and x are expressed in volts. Note that this function is presented for illustrative purposes only and can be replaced by any arbitrary function to be implemented. In FIG. 4 the function $f(x)$ given above is calculated for different voltages, as shown at 350. The signal output by the prior art A/D/A circuit is represented by reference numeral 352. The signal output by the A/D/A circuit of the present invention (FIG. 3) is represented by reference numeral 354. The curves 352, 354 represent the output from a circuit that utilizes an A/D and a D/A converter having a resolution of 1 V/step. The curve 354 represents a digitized function generated by the present invention, utilizing a dither signal having 10 steps of 0.1 V each while using the same memory content as the prior art. The curve 354 is clearly smoother and better resembles the input curve 350.

Figure 5:
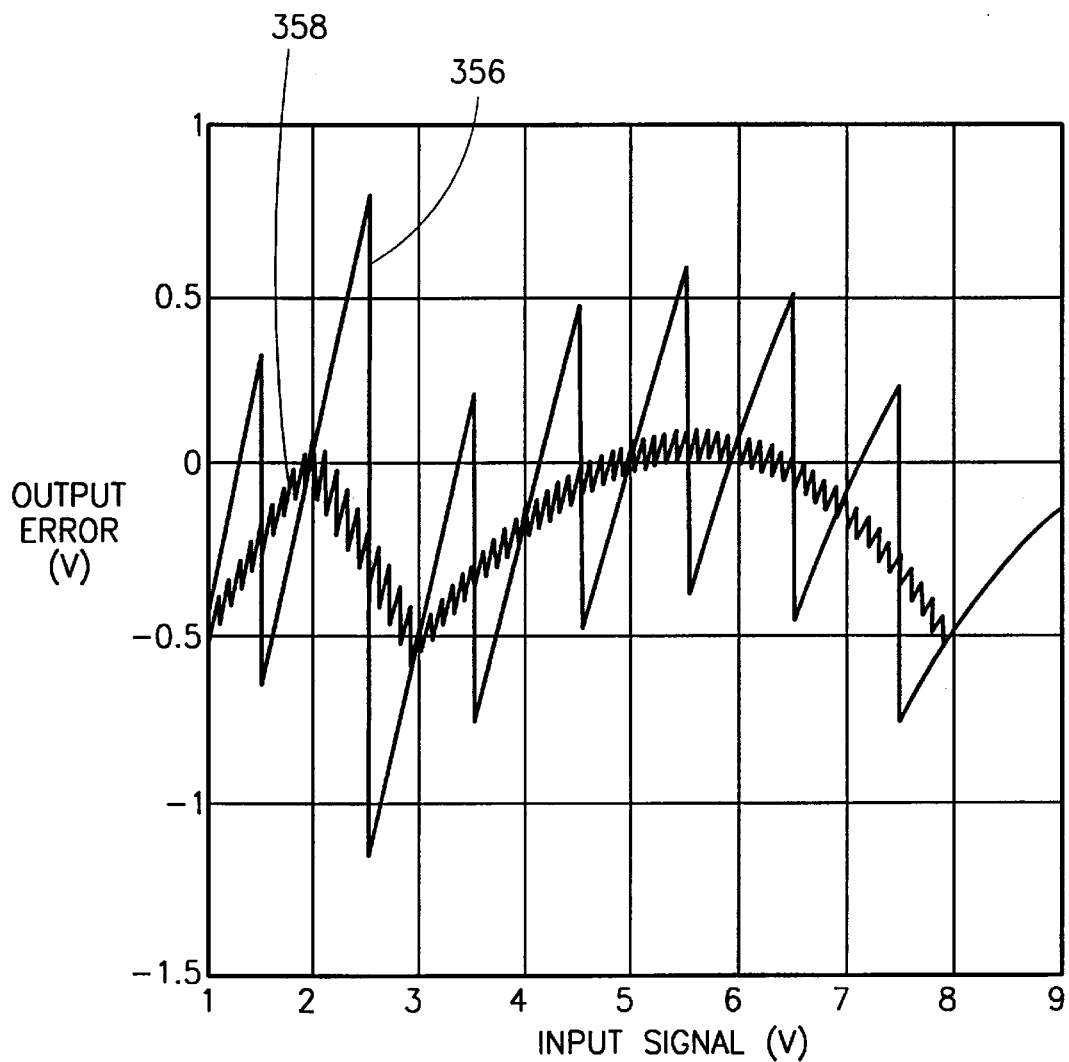
FIG. 5 is a graph illustrating the error difference signal between the example continuous analog output signal and the output signal generated by the A/D/A circuit of the prior art and that generated by the A/D/A circuit of the present invention.

A graph illustrating the error difference signal in volts between the ideal analog output signal and the output signal generated by the A/D/A circuit of the prior art and that generated by the A/D/A circuit of the present invention is shown in FIG. 5. Error curve 356 was generated by subtracting the ideal output curve 350 (FIG. 4) from the output curve 352 of the prior art circuit. Error curve 358 was generated by subtracting the ideal output curve 350 from the output curve of the A/D/A circuit of the present invention. The curve 358 is clearly much smoother and represents far less signal error than curve 356.

The present invention is suitable for use with numerous applications. One such set of applications is function transformers. A high level block diagram illustrating a prior art function transformer circuit employing A/D and D/A conversions is shown in FIG. 6. The function generator, generally referenced 30, comprises an A/D converter 32, digital circuitry and/or memory 34 and D/A converter 36. The function generator 30 is used to transform an analog input signal into an output signal that is some function of the input signal. A more detailed description of a function transformer can be found in U.S. Pat. No. 5,006,850.

The analog input signal is converted to digital form using A/D converter 32. The digital output of the A/D converter serves as the input address to the digital circuitry/memory 34. The memory functions as a look-up table and may comprise volatile or non-volatile memory. The data read form the memory is input to the D/A converter which outputs the resultant analog signal. Digital circuitry can be utilized as an alternative to the memory. Suitable processing means, such as a digital signal processor (DSP), may be used which is operative to calculate the output digital value for each input value from the A/D converter. One disadvantage of this prior art circuit is that very large memories are required in order to achieve high resolution. In addition, the output signal contains inaccuracies due to quantization errors in the A/D and D/A converters.

The application of the present invention to a function transformer results in improved accuracy at the output. With reference to FIG. 3, the function transformer role is performed by the digital processing means 108. In operation, the digital processing means 108 outputs a digital value in accordance with the digital value output by the A/D converter 106 based on a predefined logic function. The digital processing means can comprise a memory based look-up table, digital circuitry, DSP based circuit or any combination of the above. Since the resolution and accuracy of the system is improved by the injection of the dither signal, the memory size requirements for the loop-up table memory are greatly reduced. Similarly, the complexity level required of any digital logic or DSP algorithms that may be used is reduced. Another benefit of this system is that a much smoother signal is output.

Another application of the present invention is with use in digital temperature compensated crystal oscillator (DTCXO) circuit. One such prior art DTCXO circuit is disclosed in U.S. Pat. No. 4,746,879. A high level block diagram illustrating a prior art digital temperature compensated crystal oscillator (DTCXO) circuit is shown in FIG. 7. The circuit, generally referenced 40, comprises a temperature sensor 42, A/D converter 44, look-up table 46, D/A converter 48 and voltage controlled crystal oscillator (VCXO) 50. In order to achieve the required frequency stability, the look-up table typically must comprise expensive large capacity memories. To achieve very stable frequencies, high resolution A/D and D/A converters are required which requires that the memories have sufficient bit width to match the A/D converter output value bit width and the D/A input width. Further, a relatively large look-up table memory is required if the oscillator must operate over a wide temperature range or if there is very little tolerance for frequency drift.

Attempts at reducing the size of the look-up table memory have been made in the prior art. One technique utilizes interpolation curve fitting methods, while others are based on function generation using stored coefficients. A disadvantage of these prior art techniques is that they require the use of complex processing mechanisms in their operation and manufacture for loading the required data into the memory making up the look-up table, for retrieving the data during operation and for processing the data to yield the required correction value.

Another disadvantage with the prior art circuit of FIG. 7 is that the DTCXO circuit 40 measures the temperature on a periodic basis to determine the operating temperature of the crystal within VCXO 50 as any particular instant in time. The circuit 40 generates frequency correction signals which function to compensate the resonant frequency versus temperature characteristics of a particular oscillator, such as a crystal oscillator, over a given temperature range. The data that is used to generate the correction signals for a given oscillator are typically stored in non-volatile memory at the time the oscillator is manufactured. During operation, the TCXO monitors the temperature of the oscillator at periodic intervals, retrieves the compensation data from the memory for the temperature range associated with the current temperature and functions to convert the data to an appropriate correction signal. The correction signal serves to tune the oscillator back to the correct nominal output frequency.

Since DTCXOs approximate the characteristic frequency/ temperature curve of the crystal with a finite number of discrete temperature values, an oscillator of this type can produce an abrupt change frequency if the crystal temperature changes sufficiently enough to cause the compensation circuitry to move to a different discrete value. This sudden frequency change can cause undesirable effects to systems that require stable reference clocks. For example, when used as a frequency reference for a radio transceiver, these discrete frequency steps generate spurious frequency and phase fluctuations or shifts. Consequently, these frequency and phase shifts appear in the modulated transmitter and receiver frequencies which may cause frequency instability, commonly referred to as phase noise or phase jitter, to be added to the transmitted or received signal. These types of spurious modulation noise sources can interfere not only with voice traffic but data traffic as well, at both sending and receiving ends of the radio communication link. In addition, the frequency and phase fluctuation noise can cause a loss in signal synchronization. In the case where audio signals are being transmitted, the frequency and phase shifts cause audible noise in the system.

Some prior art solutions are based on inhibiting the temperature compensation updates during critical time intervals. For example, in a radio transceiver, the critical time intervals may be during periods of reception and transmission. Thus, during these times, the temperature compensation circuitry would be temporarily suspended and prevented from updating the output frequency, i.e., applying any correction factors. This solution is discussed in more detail in U.S. Pat. Nos. 5,204,975 and 5,459,436.

A disadvantage with these prior art solutions is that additional hardware and complexity are required because specific circuitry must be added for detecting the critical time interval and generating some type of inhibit signal. Also, the temperature compensation circuitry must be modified to receive and make use of the inhibit signal. Another disadvantage is that while the temperature compensation circuitry is inhibited, the frequency drift may worsen and eventually exceed predefined limits.

Figure 8:
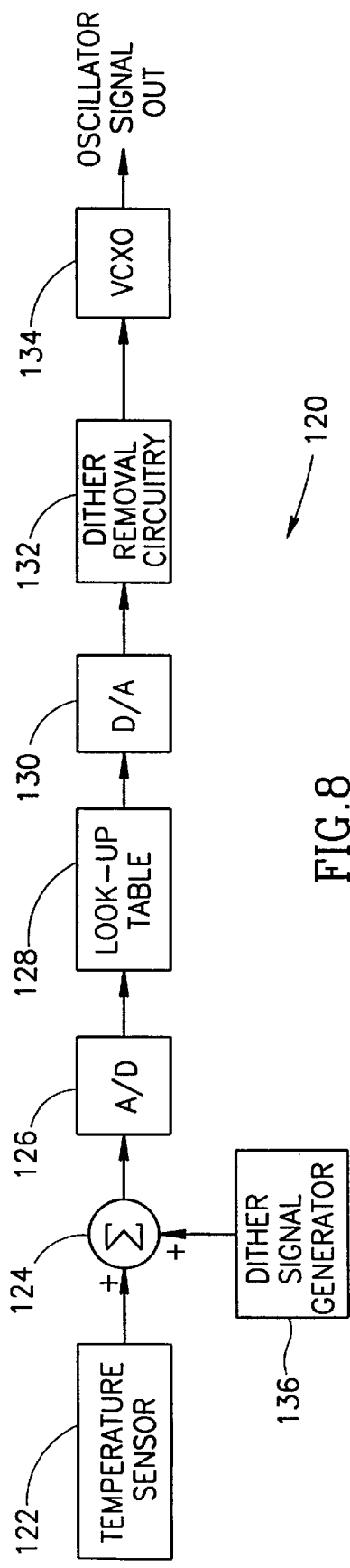
FIG. 8 is a high level block diagram illustrating a DTCXO circuit constructed in accordance with a second embodiment of the present invention.

The use of the present invention in a DTCXO circuit results in smooth and accurate temperature compensation, thus eliminating the memory size and abrupt frequency change problems of the prior art. A high level block diagram illustrating a DTCXO circuit constructed in accordance with a second embodiment of the present invention is shown in FIG. 8. The DTCXO circuit, generally referenced 120, comprises a temperature sensor 122, summer or adder 124, dither signal generator 136, A/D converter 126, look-up table 128, D/A converter 130, dither removal circuitry 132 and voltage controlled crystal oscillator (VCXO) 134.

In operation, the output signal of the temperature sensor is combined with the dither signal and the combination is then converted by the A/D converter. The output of the A/D converter is used as the input address the look-up table. The look-up table, e.g., non-volatile memory, comprises the compensation data for the particular temperature range and VCXO. The output of the look-up memory is converted to analog and the dither then removed. The dither removal circuitry may comprise a low pass filter. The output of the dither removal circuitry comprises the compensation signal that is input to the VCXO.

One advantage of the DTCXO circuit of FIG. 8 is that smaller memories may be utilized for the look-up table because of the improved accuracy of the system. Another advantage is that since the output compensation signal is smoother, i.e., of higher resolution, it is not necessary to inhibit the temperature compensation circuit during critical time intervals.

Figure 9:
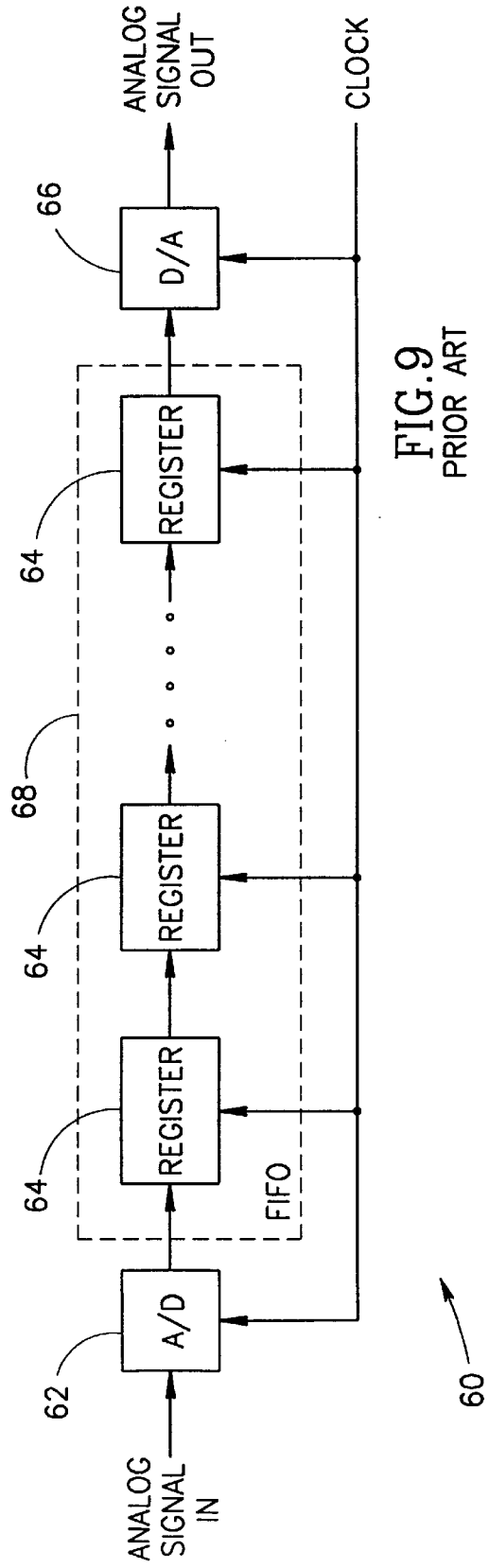
FIG. 9 is a high level block diagram illustrating a prior art time delay circuit which utilizes a series of registers to perform the delay function.

Another application of the present invention is to digital time delay circuits. An example of a prior art time delay circuit is disclosed in U.S. Pat. No. 5,576,709, issued to Onaya et al., which teaches a delay circuit using a digital memory. A high level block diagram illustrating a prior art analog time delay circuit which utilizes a series of registers to perform the delay function is shown in FIG. 9. The circuit, generally referenced 60, shown in the Figure is a well known technique for time delaying an analog signal. The circuit comprises an A/D converter 62, a first in first out (FIFO) register array or file 68 and a D/A converter 66. The FIFO comprises a plurality of registers 64 connected is series.

In operation, the analog input signal is digitized by the A/D converter and the digital data is then shifted by a chain of memory registers synchronized by a clock signal. Typically, the registers are grouped into one device called a FIFO. The output digital signal is then converted back into analog form by means of a D/A converter. The delay time is determined by the number of registers and the clock signal rate.

In order to faithfully reconstruct the input analog signal with little distortion, the A/D and D/A converters and the FIFO registers must be of sufficient width, i.e., a sufficiently large number of bits wide. This increases the cost and complexity of the circuit considerably.

Figure 10:
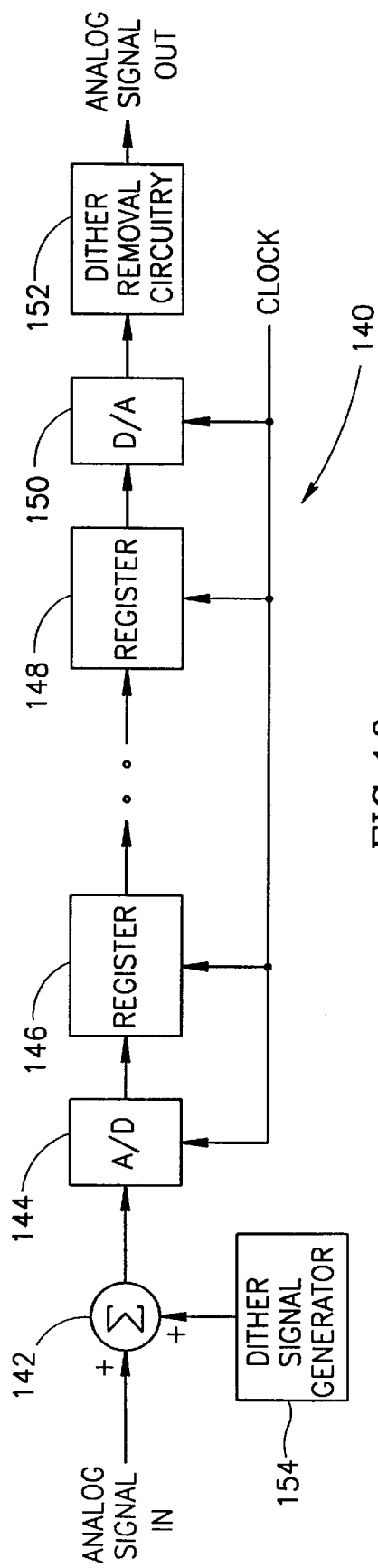
FIG. 10 is a high level block diagram illustrating a delay circuit constructed in accordance with a third embodiment of the present invention.

The application of the present invention to a delay system will now be described. A high level block diagram illustrating a delay circuit constructed in accordance with a third embodiment of the present invention is shown in FIG. 10. The delay circuit, generally referenced 140, comprises a summer or adder 142, dither signal generator 154, A/D converter 144, a plurality of registers 146, 148, a D/A converter 150 and dither removal circuitry 152. The registers may optionally be part of a FIFO register device.

The analog dither signal output by the dither signal generator is added to the input analog signal prior to its conversion to digital and is subsequently removed from the output after being delayed and converted to analog form. The circuit is operative to yield a high resolution output signal having low distortion, while utilizing inexpensive low resolution A/D and D/A converter devices. However, in order to achieve significant improvements over a system that does not use dithering, the clock rate must be raised to increase the number of samples output. Thus, additional registers may be required in order to provide the same amount of time delay as the original system without dither signal injection. Note that rather than improve accuracy, the present invention can be used to provide the same accuracy of the original system but utilizing fewer bit lines to represent the digital samples.

Figure 11:
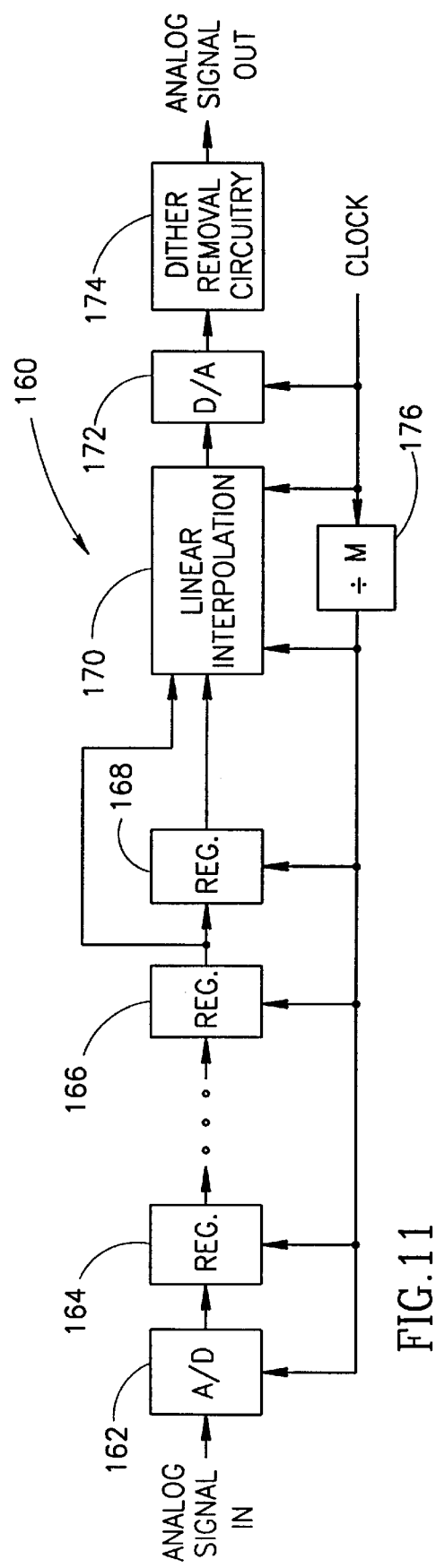
FIG. 11 is a high level block diagram illustrating the delay circuit of the present invention wherein linear interpolation is utilized before D/A conversion to improve the accuracy of the converted signal.

In an alternative embodiment of the present invention, the number of registers and thus the memory requirements can be significantly reduced by using the last two registers in the delay chain for pseudo dither generation. A high level block diagram illustrating the delay circuit of the present invention wherein linear interpolation is utilized before D/A conversion to improve the accuracy of the converted signal and reduce the required memory is shown in FIG. 11. The delay circuit, generally referenced 160, comprises an A/D converter 162, a plurality of registers 164, 166, 168, linear interpolation means 170, divider 176, D/A converter 172 and dither removal circuitry 174.

The A/D converter and registers are similar to that of the delay circuit of FIG. 10. The last two registers 166, 168 have their outputs available for input to the linear interpolation means. The values that are stored in these last two registers are linearly interpolated so as to effectively perform a dithering function. The D/A converter is clocked at a higher clock rate than the A/D converter and the registers. A divide by M divider 176 can be used to generate the clocks for the A/D converter and the registers from the faster clock that is used for the D/A converter. Alternatively, the clock for the D/A converter can be independently generated.

The linear interpolator comprises digital logic circuitry, operating at the higher clock rate together with the D/A converter, which functions to perform linear interpolation on the last two register values. The slower clock is also input to the linear interpolator for interfacing with registers 166, 168. The linear interpolator generates digital values that are between those of the values contained in the last two registers. The D/A converter converts this interpolated value to analog and the dither is subsequently removed by the dither removal circuitry. The dither removal circuitry is optional and may comprise a low pass filter.

In the alternative embodiment disclosed in FIG. 11, the linear interpolator comprises logic that generates interpolation values between two input values. For example, the logic can implement linear interpolation using the following function.

$$A \cdot X(N) + (1-A) \cdot X(N-1)$$

Where $X(N)$ is the digital value stored in the last register 166 and $X(N-1)$ is the digital value stored in the next to last register 168. The value A is a parameter that is swept from 0 to 1 during each register clock period and N represents time. In this embodiment, there is little need for dither removal since no actual dither signal is injected into the input analog signal before it is converted to digital. Thus, a high resolution output signal is generated using linear interpolation between two consecutive data samples.

Figure 12:
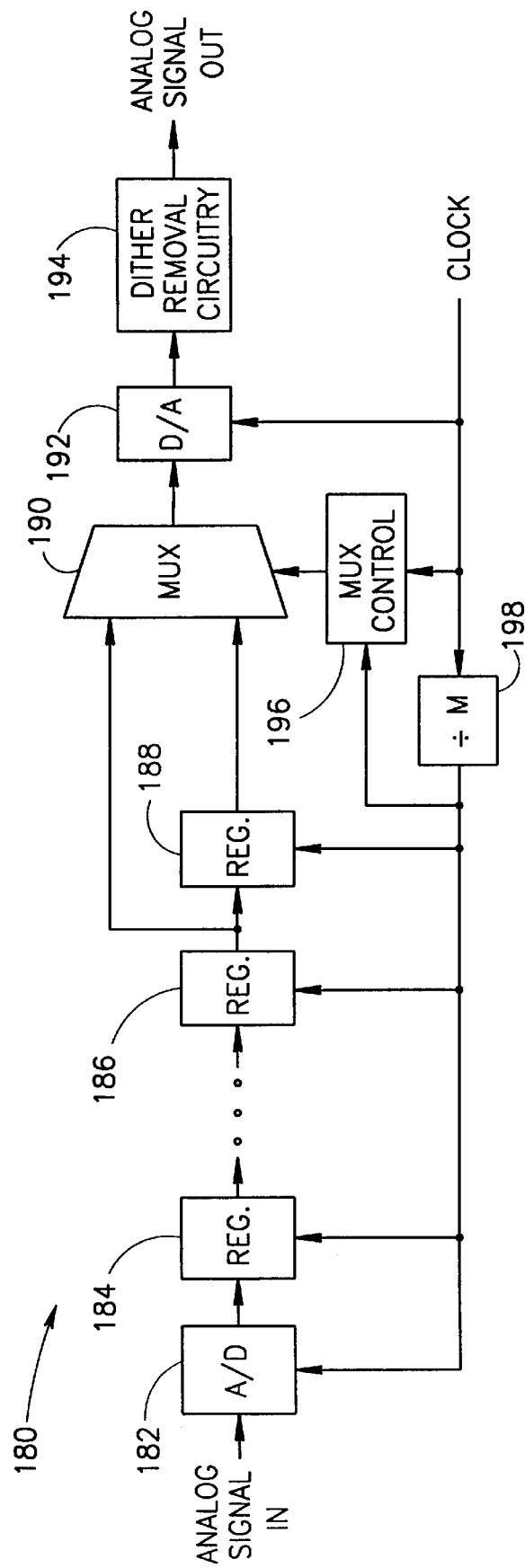
FIG. 12 is a high level block diagram illustrating the delay circuit of the present invention wherein a plurality of register values are multiplexed before D/A conversion to improve the accuracy of the converted signal.

In an another alternative embodiment for enhancing the output resolution, two or more of the register values at the end of the time delay chain are multiplexed before the D/A converter and subsequently averaged. A high level block diagram illustrating the delay circuit of the present invention wherein a plurality of register values are multiplexed before D/A conversion to improve the accuracy of the converted signal is shown in FIG. 12. The delay circuit, generally referenced 180, comprises an A/D converter 182, a plurality of registers 184, 186, 188, a multiplexer 190, multiplexer controller 196, divider 198, D/A converter 192 and dither removal circuitry 194.

The A/D converter and register chain is similar to that of the delay circuit of FIG. 11. The linear interpolator, however, is replaced by a multiplexer (mux) 190 and associated mux control circuitry 196. The digital values in the last two registers in the time delay chain are input to a mux. The mux is clocked at a higher rate than the A/D converter and registers 184. The slower clock is also input to the mux control for interfacing the mux to registers 186, 188. The divide by M divider 198 functions to generate the slower clock from the high clock that is input to the mux control/mux and the D/A converter.

Note that even greater accuracy can be achieved by the pseudo dithering circuits of FIGS. 11 and 12 by employing more than two registers to generate the output value. Further, the linear interpolator 170 of FIG. 11 can alternatively perform nonlinear interpolation on the input register values rather than linear interpolation.

In operation, during the first half of one clock period of the D/A converter, the value of the register 188 is output. During the second half of the clock period, the value stored in register 188 and register 186 are alternatively output at a high rate. This is in contrast to the prior art circuit of FIG. 9 where each digital value is converted to analog and output throughout the entire clock period.

In the circuit of FIG. 12, both values are switched in alternative fashion at a high rate to the output to form the output analog signal. The removal of the dither signal can be accomplished using a low pass filter which functions to average the two values to a mean value. This mean value represents an additional output level representing the middle of the two input values that was not available from the D/A converter. Greater resolution can be achieved by increasing the number of registers that are multiplexed to the D/A converter. The higher the number of registers the higher the number of available levels in the output, thus yielding an increase in output resolution, increased output signal smoothness with less distortion. Further, the weight or time partition assigned to the two multiplexed values does not necessarily have to be 50/50. Alternatively, any desired value of weight or time partition can be applied to the two values.

Figure 13:
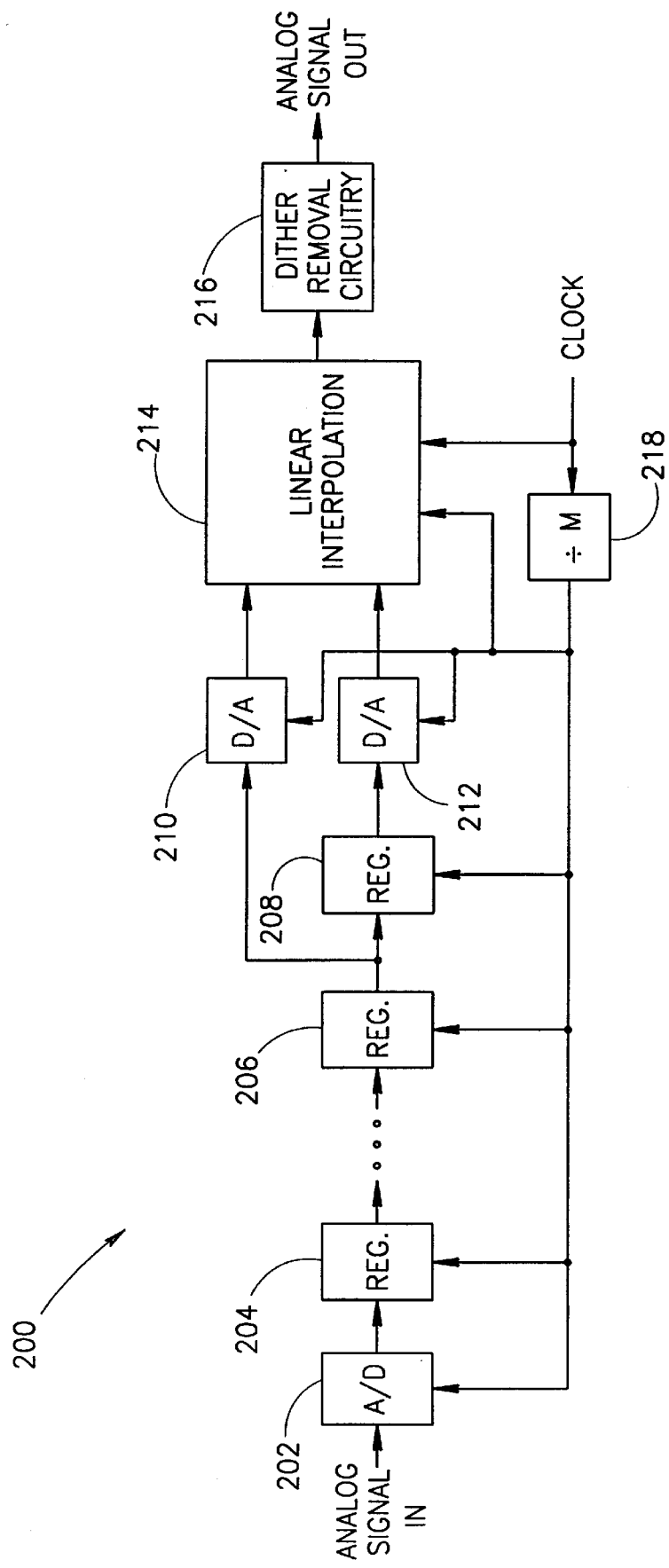
FIG. 13 is a high level block diagram illustrating the delay circuit of the present invention wherein linear interpolation is utilized after D/A conversion to improve the accuracy of the converted signal.

Alternatively, rather than process the last register values digitally, they can be processed using analog means after the D/A conversion. A high level block diagram illustrating the delay circuit of the present invention wherein linear interpolation is utilized after D/A conversion to improve the accuracy of the converted signal is shown in FIG. 13. The delay circuit, generally referenced 200, comprises an A/D converter 202, a plurality of registers 204, 206, 208, a D/A converters 210, 212, linear interpolation means 214, divider 218 and optional dither removal circuitry 216.

In this delay circuit, the outputs of the last two registers 206, 208 are input to D/A converters 210, 212, respectively. The outputs of both D/A converters are connected to linear interpolation means 214. Both the slower clock and the faster clock are input to the linear interpolator for interfacing with D/A converters 210, 212. The linear interpolator comprises analog processing circuitry that performs a similar function as the linear interpolator of the delay circuit of FIG. 11 with the exception that the linear interpolator in this case is analog based. For example, the linear interpolator can implement linear interpolation using the following function.

$$A \cdot X(N) + (1-A) \cdot X(N-1)$$

Where X(N) is the analog representation of the digital value stored in the last register 206 and X(N−1) is the analog representation of the digital value stored in the next to last register 208. The value A is a parameter that is swept from 0 to 1 during each register clock period and N represent time. Here too, dither removal is not essential since no dither signal was combined with the input analog signal initially.

Figure 14:
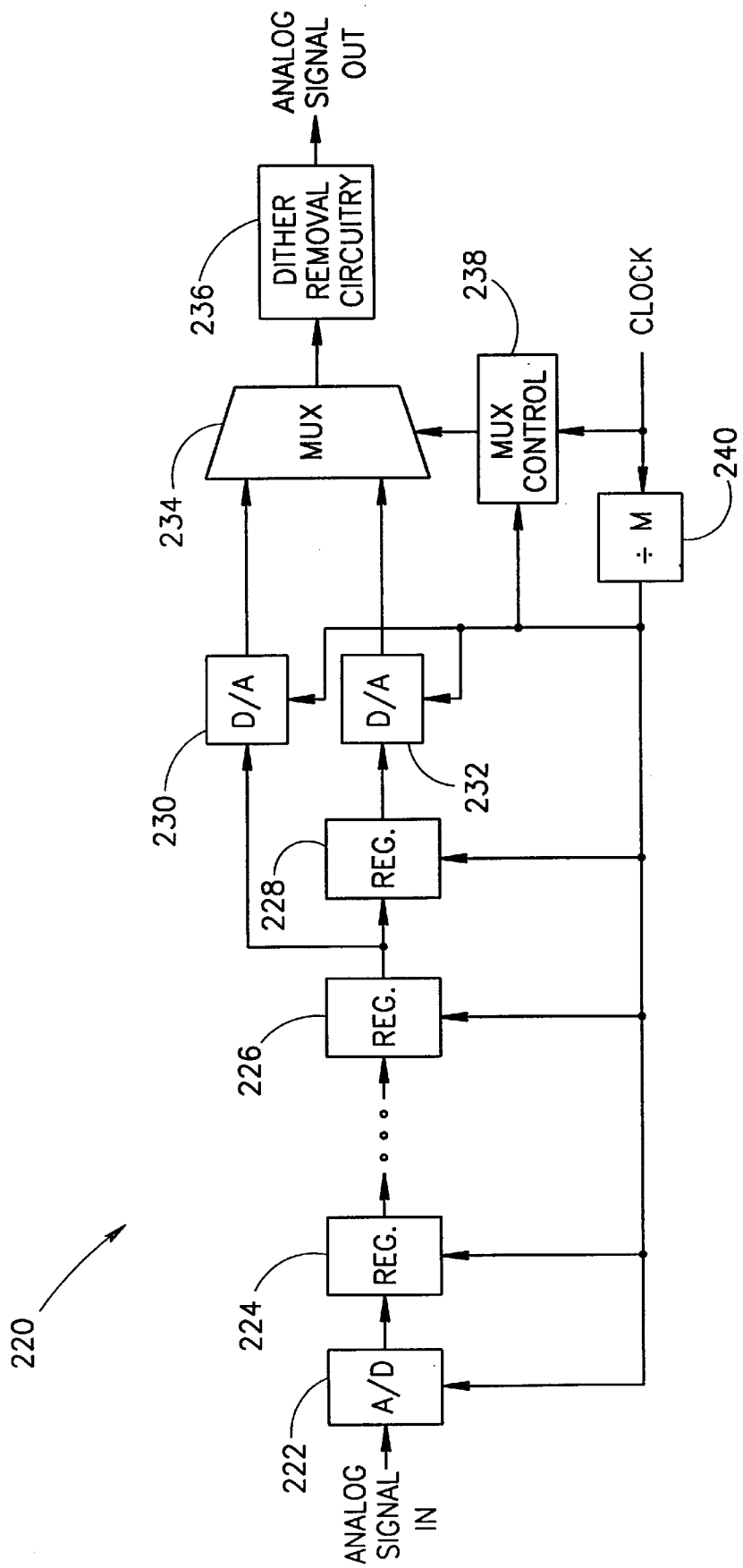
FIG. 14 is a high level block diagram illustrating the delay circuit of the present invention wherein a plurality of register values are multiplexed after D/A conversion to improve the accuracy of the converted signal.

Similarly, the digital multiplexing technique of the delay circuit of FIG. 12 can be implemented in analog as well. A high level block diagram illustrating the delay circuit of the present invention wherein a plurality of register values are time multiplexed after D/A conversion to improve the accuracy of the converted signal is shown in FIG. 14. The delay circuit, generally referenced 220, comprises an A/D converter 222, a plurality of registers 224, 226, 228, a multiplexer 234, multiplexer controller 238, divider 240, D/A converters 230, 232 and dither removal circuitry 236.

The A/D converter and register chain is similar to that of the delay circuit of FIG. 13. The linear interpolator, however, is replaced by a multiplexer (mux) 234 and associated mux control circuitry 238. The digital values in the last two registers in the time delay chain are input to the mux. The mux is clocked at a higher rate than the A/D converter and registers 224 thus providing pseudo dithering. The divide by M divider 240 functions to generate the slower clock from the high clock that is input to the mux control/mux and the D/A converter. The slow clock is also input to the mux control for interfacing the mux to D/A converters 230, 232.

In operation, during one clock period of the D/A converter, the next to last register 226 is connected to the D/A converter for half the time while the last register 228 is connected to the D/A converter during the other half of the time. Both values are switched in alternative fashion at a high rate to the output to form the output analog signal. The removal of the dither signal can be accomplished using a low pass filter which functions to average the two values to a mean value. This mean value represents an additional output level representing the middle of the two input values that was not available from the D/A converter. As in the delay circuit of FIG. 12, greater resolution can be achieved by increasing the number of registers that are multiplexed after D/A conversion. The higher the number of registers the higher the number of available levels in the output, thus yielding an increase in output resolution, increased output signal smoothness with less distortion.

Note that even greater accuracy can be achieved by the pseudo dithering circuits of FIGS. 13 and 14 by employing more than two registers to generate the output value. Further, the linear interpolator 214 of FIG. 13 can alternatively perform nonlinear interpolation on the output of the D/A converters rather than linear interpolation.

Figure 15:
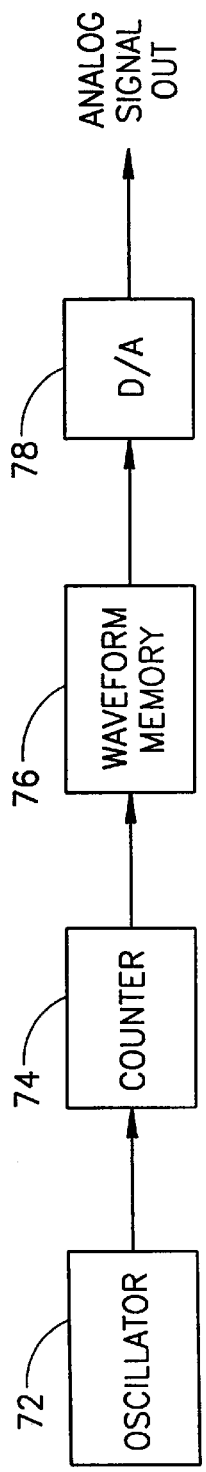
FIG. 15 is a high level block diagram illustrating a prior art waveform generator utilizing a memory device to store waveform information.

Yet another application of the present invention is to a waveform generator. The method of generating a single or periodic waveform is well known in the art. A high level block diagram illustrating a prior art waveform generator utilizing a memory device to store waveform information is shown in FIG. 15. The waveform generator, generally referenced 70, comprises an oscillator 72, counter 74, waveform memory 76 and a D/A converter 78. One complete period of the desired waveform is calculated, digitized and stored in the waveform memory. Alternatively, the waveform can be generated by a DSP circuit or equivalent logic processing elements. The oscillator output is input to the counter which functions to generate sequential input addresses for the waveform memory. The counter generates addresses so as to sweep the contents of the memory and thus generate the desired waveform signal. The digital output of the waveform memory is converted to analog by D/A converter.

In order to generate a high resolution reproduction of the desired waveform having low distortion, a large number of samples must be used. In addition, very wide memories along with wide A/D and D/A converters and must be used in order to the achieve high resolution for each sample output. This requires the use of large wide memories which increase the cost and complexity of the circuit. Further, a large memory requires a suitably fast oscillator frequency to able to address the contents of the memory in the given time period of the waveform. Another disadvantage is that inaccuracies in the output signal are introduced because of the quantization errors of the A/D and D/A converters.

Figure 16:
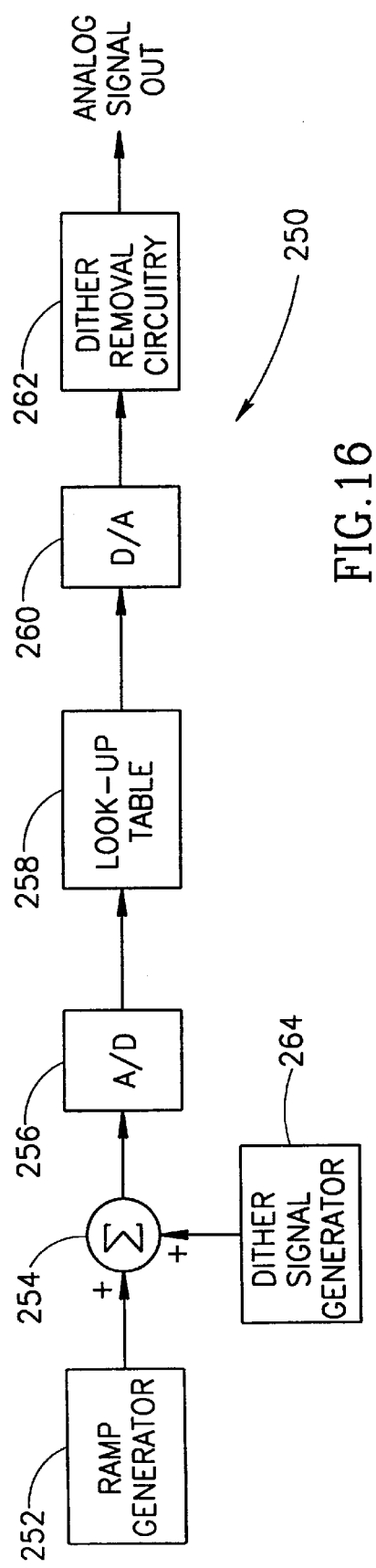
FIG. 16 is a high level block diagram illustrating a waveform generator constructed in accordance with a fourth embodiment of the present invention.

The principles of the present invention are applicable to a waveform generator as well. A high level block diagram illustrating a waveform generator constructed in accordance with a fourth embodiment of the present invention is shown in FIG. 16. The waveform generator, generally referenced 250, comprises a ramp generator 252, summer or adder 254, dither signal generator 264, A/D converter 256, look-up table 258, D/A converter 260 and dither removal circuitry 262.

This waveform generator circuit is very similar to the circuit of FIG. 2 with the exception that the input analog signal is replaced with the ramp generator 252. The ramp generator functions to generate a signal so as to sweep the entire contents of the look-up table. The look-up table may comprise memory, a DSP based circuit or digital logic that functions to produce a sample of the waveform in accordance with an input value. The advantages of this circuit are a higher resolution output signal having lower distortion due to the injection of the dither signal. Alternatively, the same resolution output can be achieved using fewer signal lines and less bits for the digital samples. Signals other than a ramp may be combined with the dither signal so as to produce complex sophisticated output signals.

Similar to the delay circuit embodiments of FIGS. 9 through 12, higher accuracy can be achieved by adding digital logic between the counter and the memory of the prior art waveform generator circuit of FIG. 15. The logic added functions to utilize consecutive readings of the memory to implement pseudo or artificial dithering. In the case of the counter, consecutive readings imply higher or lower counts in addition to the current counter value. These additional values are used to generate artificial dither values.

Figure 17:
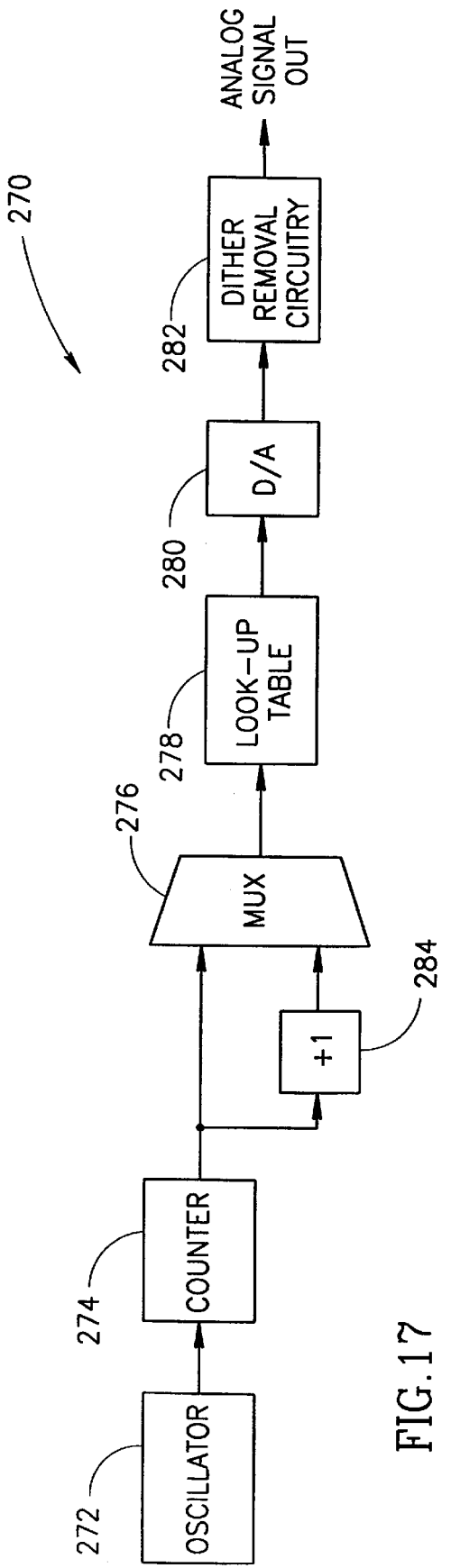
FIG. 17 is a high level block diagram illustrating the waveform generator of the present invention wherein the waveform memory contents are time multiplexed to improve the accuracy of the generated signal.

A high level block diagram illustrating the waveform generator of the present invention wherein the waveform memory contents are time multiplexed to improve the accuracy of the generated signal is shown in FIG. 17. The waveform generator, generally referenced 270, comprises an oscillator 272, counter 274, mux 276, incrementer or adder 284, look-up table 278, D/A converter 280 and dither removal circuitry 282.

The increment function 284 adds one to the current value output by the counter. Both the counter value and the counter value +1 are input to the multiplexer. The output of the mux is used as the input address to the look-up table memory. Note that the clock to the mux, look-up table memory and the D/A converter must be higher than that of the counter. For each clock cycle of the counter, two values from the look-up table are converted to analog. The analog output of the D/A converter is low pass filtered by the dither removal circuitry. The time multiplexing of two look-up table values during each counter clock cycle yields an output value having higher resolution and less distortion.

Figure 18:
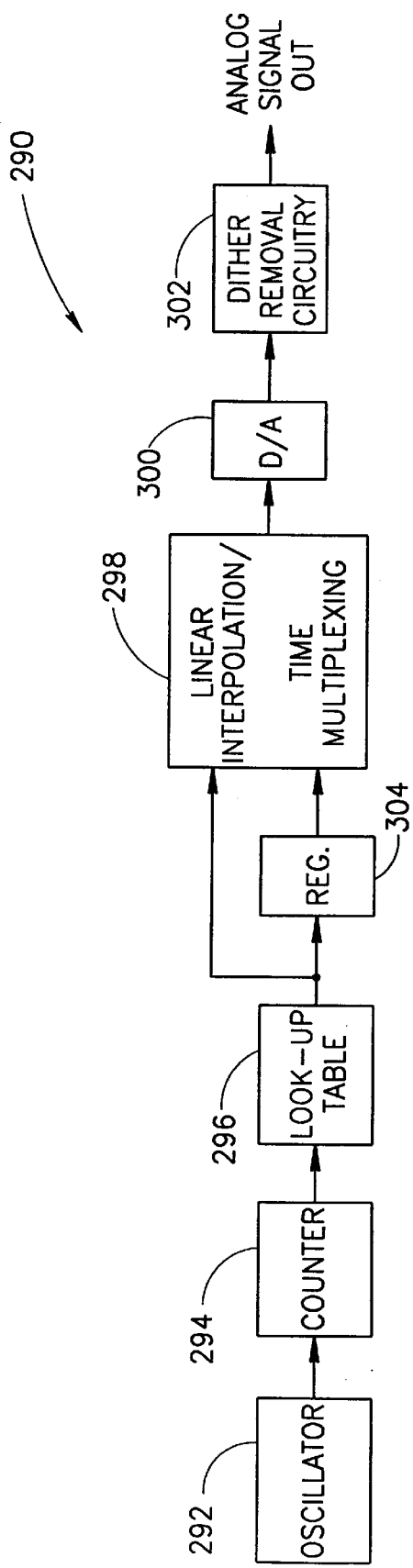
FIG. 18 is a high level block diagram illustrating the waveform generator of the present invention wherein linear interpolation or time multiplexing before D/A conversion is utilized to improve the accuracy of the generated signal.

Alternatively, the output of the look-up table can be either linear interpolated or time multiplexed using digital means to achieve the desired increase in output accuracy. A high level block diagram illustrating the waveform generator of the present invention wherein linear interpolation or time multiplexing after the look-up table but before D/A conversion is utilized to improve the accuracy of the generated signal is shown in FIG. 18. The waveform generator, generally referenced 290, comprises an oscillator 292, counter 294, look-up table memory 296, register 304, linear interpolator/time multiplexer 298, D/A converter 300 and dither removal circuitry 302.

In this circuit, the counter output is swept over the contents of the look-up table memory. The sample output of the look-up table memory is output to a register. The register functions to generate a one cycle delay of the sample. Both values are input to digital circuitry 298 that functions to either perform linear interpolation as in the delay circuit of FIG. 11 or time multiplexing as in the delay circuit of FIG. 12. In either case, the output of the circuit 298 is a value that is in between the two initial input values. The D/A converter 300 converts the output of the circuitry 298 to analog and the dither removal circuitry low pass filters the output signal.

Figure 19:
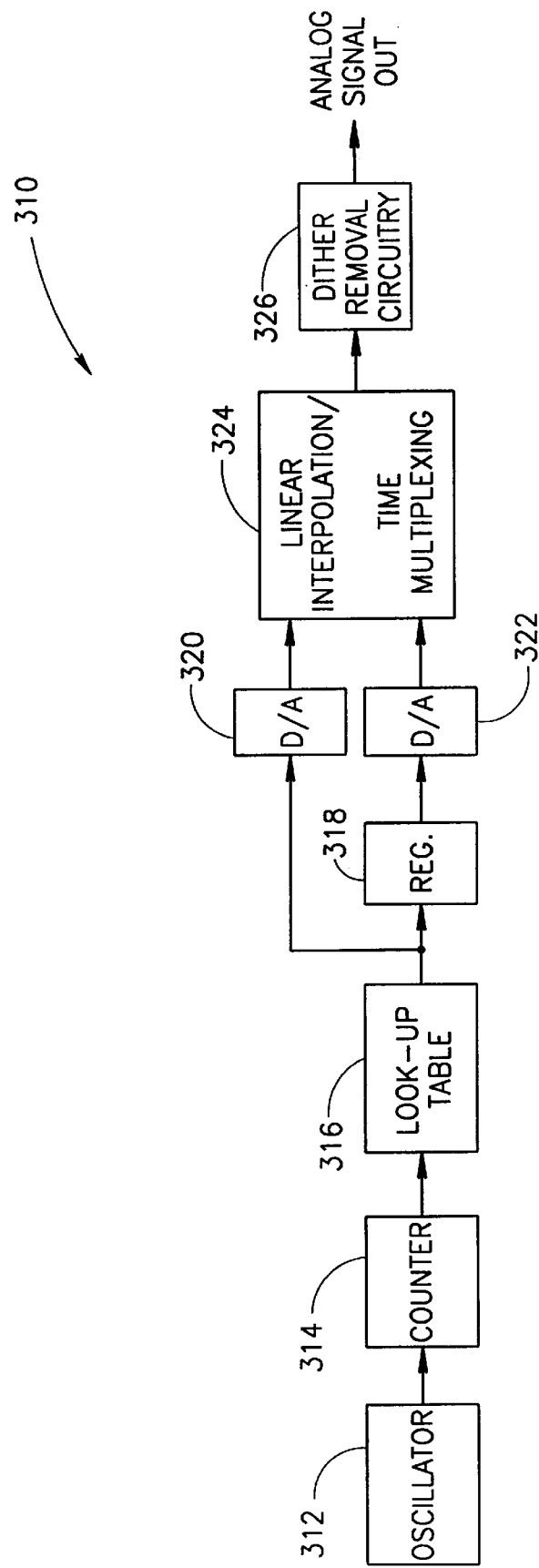
FIG. 19 is a high level block diagram illustrating the waveform generator of the present invention wherein linear interpolation or time multiplexing after D/A conversion is utilized to improve the accuracy of the generated signal.

In another alternative embodiment, the output of the look-up table can be either linear interpolated or time multiplexed using analog means to achieve the desired increase in output accuracy. A high level block diagram illustrating the waveform generator of the present invention wherein linear interpolation or time multiplexing after the look-up table but after D/A conversion is utilized to improve the accuracy of the generated signal is shown in FIG. 19. The waveform generator, generally referenced 310, comprises an oscillator 312, counter 314, look-up table memory 316, register 318, linear interpolator/time multiplexer 324, D/A converters 320, 322 and dither removal circuitry 326.

As in the previous circuit, the counter output is swept over the contents of the look-up table memory. The sample output of the look-up table memory is output to a register. The register functions to generate a one cycle delay of the sample. The output of the look-up table is input to D/A converter 320 and the output of the register is input to D/A converter 322. The output both D/A converters are input analog circuitry 324 that functions to either perform linear interpolation as in the delay circuit of FIG. 13 or time multiplexing as in the delay circuit of FIG. 14. In either case, the output of circuitry 324 is a value that is in between the two initial input values. The output of the circuitry 324 is input to the dither removal circuitry which functions to low pass filter the output signal.

The principles of the present invention is not limited to the application examples described hereinabove but are applicable to any case wherein a continuous signal is generated from consecutive digital sample. The use of the present invention achieves results having higher resolution, less distortion and increased smoothness. Or, alternatively, the same resolution output can be achieved utilizing fewer bit lines. The analog signals output by the circuits incorporating the present invention have fewer transients which would otherwise appear in the output in the form of successive step functions due to the discrete nature of the sample values.

For example, the principles of the present invention can be used with pen plotters or pen recorders to adapt the output to the limited speed of the mechanical pen assembly. Furthermore, a smooth continuous chart output is more aesthetically pleasing than a drawing riddled with staircasing. A system suitable for adapting the principles of the present invention is described in U.S. Pat. No. 4,308,585, incorporated herein by reference, which discloses front end circuitry for an XY plotter. A point joining circuit is disclosed which functions to insert interpolated sample values between values read from a memory. Two consecutive samples are input to the ends of a potential divider chain to generate a linear series of intermediate interpolation values which are subsequently output to the plotter.

While the invention has been described with respect to a limited number of embodiments, it will be appreciated that many variations, modifications and other applications of the invention may be made.

What is claimed is:

1. An apparatus for delaying an input analog signal to generate an output analog signal, comprising:

an analog dither signal generator;

means for combining said analog dither signal with the analog input signal to generate a first combined analog signal;

first conversion means for converting said first combined analog signal into a digital signal;

delay means for delaying said digital signal;

second conversion means for converting said delayed digital signal into a second combined analog signal; and means for removing said analog dither signal component from said second combined analog signal to yield the output analog signal.

2. A method of delaying an input analog signal to generate an output analog signal, said method comprising the steps of:

converting the input analog signal into a digital signal;

delaying said digital signal to yield at least a first delayed digital signal and a second delayed digital signal, said first digital signal delayed less in time than said second digital signal;

processing said first delayed digital signal and said second delayed digital signal so as to generate a plurality of digital signals whose combination, after conversion to analog, is smoother and more accurate then the combination of said first delayed digital signal and said second delayed digital signal alone; and converting said plurality of digital signals into analog form to yield a raw analog signal having superimposed thereon a pseudo-dither signal, and removing the pseudo-dither signal from the raw analog signal so as to yield the output analog signal.

3. The method according to claim 2, wherein said step of processing comprises the step of linearly interpolating said first digital signal and said second digital signal to generate said plurality of digital signals.

4. The method according to claim 2, wherein said step of processing comprises the step of time multiplexing said first digital signal and said second digital signal to generate said plurality of digital signals.

5. The method according to claim 2, wherein the step of removing the pseudo-dither signal includes applying low pass filter means to said raw analog signal.

6. An apparatus for delaying an input analog signal to generate an output analog signal, comprising:

first conversion means for converting said first combined analog signal into a digital signal;

delay means for delaying said digital signal so as to yield at least a first delayed digital signal and a second delayed digital signal, said first digital signal delayed less in time than said second digital signal;

processing means for generating from said first digital signal and said second digital signal a plurality of digital signals whose combination, after conversion to analog, is smoother and more accurate then the combination of said first digital signal and said second digital signal alone;

second conversion means for converting said plurality of digital signals into analog form to yield a raw analog signal having superimposed thereon a pseudo-dither signal, and filtering means for removing the pseudo-dither signal from the raw analog signal so as to yield the output analog signal.

7. The apparatus according to claim 6, wherein said processing means comprises means for linearly interpolating said first digital signal and said second digital signal to generate said plurality of digital signals.

8. The apparatus according to claim 6, wherein said processing means comprises means for multiplexing said first digital signal and said second digital signal to generate said plurality of digital signals.

9. The apparatus according to claim 6, wherein the filtering means includes means for low pass filtering said raw analog signal.

10. A method of delaying an input analog signal to generate an output analog signal, said method comprising the steps of:

converting the input analog signal into a digital signal;

delaying said digital signal to yield at least a first digital signal and a second digital signal, said first digital signal delayed less in time than said second digital signal;

converting said first digital signal and said second digital signal into a first analog and a second analog signal, respectively; and processing said first analog signal and said second analog signal so as to produce a raw analog signal having superimposed thereon a pseudo-dither signal; and removing the pseudo-dither signal from the raw analog signal so as thereby to generate the output analog signal which is smoother and more accurate then said first analog signal and said second analog signal alone.

11. The method according to claim 10, wherein said step of processing comprises the step of linearly interpolating said first analog signal and said second analog signal to generate said output analog signal.

12. The method according to claim 10, wherein said step of processing comprises the step of multiplexing said first analog signal and said second analog signal to generate said output analog signal.

13. The method according to claim 10, wherein the step of removing the pseudo-dither signal includes applying low pass filter means to said raw analog signal.

14. An apparatus for delaying an input analog signal to generate an output analog signal, comprising:

first conversion means for converting said first combined analog signal into a digital signal;

delay means for delaying said digital signal to yield at least a first delayed digital signal and a second delayed digital signal, said first digital signal delayed less in time than said second digital signal;

second conversion means for converting said first digital signal and said second digital signal into a first analog and a second analog signal, respectively; and processing means for generating from said first analog signal and said second analog signal a raw analog signal having superimposed thereon a pseudo-dither signal; and filtering means for removing the pseudo-dither signal from the raw analog signal so as to remove the pseudo-dither signal and thereby yield the output analog signal which is smoother and more accurate than said first analog signal and said second analog signal alone.

15. The apparatus according to claim 14, wherein said processing means comprises processing means for linearly interpolating said first analog signal and said second analog signal to generate said output analog signal.

16. The apparatus according to claim 14, wherein said processing means comprises means for multiplexing said first analog signal and said second analog signal to generate said output analog signal.

17. The apparatus according to claim 14, wherein the filtering means includes means for low pass filtering said raw analog signal.

18. A method of generating an output analog waveform signal, said method comprising the steps of:

generating a sequence of digital numbers;

applying said sequence of digital numbers to a processor to yield a first digital value;

delaying said first digital value to yield a second digital value;

processing said first digital value and said second digital value so as to generate a plurality of digital signals whose combination, after conversion to analog, is smoother and more accurate then the combination of said first digital value and said second digital value alone; and converting said plurality of digital signals into analog form to yield a raw analog signal having superimposed thereon a pseudo-dither signal, and removing the pseudo-dither signal from the raw analog signal so as to yield the output analog waveform signal.

19. The method according to claim 18, wherein said step of processing comprises the step of linearly interpolating said first digital value and said second digital value to generate said plurality of digital signals.

20. The method according to claim 18, wherein said step of processing comprises the step of time multiplexing said first digital value and said second digital value to generate said plurality of digital signals.

21. The method according to claim 18, wherein the step of removing the pseudo-dither signal includes applying low pass filter means to said raw analog signal.

22. An apparatus for generating an output analog waveform signal, comprising:

generating means for generating a sequence of digital numbers;

memory means coupled to said generating means, said memory means operative to yield a first digital value in accordance with said sequence of digital numbers delay means for delaying said first digital value to yield a second digital value;

processing means for generating from said first digital value and said second digital value a plurality of digital signals whose combination, after conversion to analog, is smoother and more accurate then the combination of said first digital value and said second digital value alone; and conversion means for converting said plurality of digital signals into analog form to yield a raw analog signal having superimposed thereon a pseudo-dither signal, and filtering means for removing the pseudo-dither signal from the raw analog signal so as to yield the output analog waveform signal.

23. The apparatus according to claim 22, wherein said processing means comprises means for linearly interpolating said first digital value and said second digital value to generate said plurality of digital signals.

24. The apparatus according to claim 22, wherein said processing means comprises means for multiplexing said first digital value and said second digital value to generate said plurality of digital signals.

25. The apparatus according to claim 22, wherein the filtering means includes means for low pass filtering said raw analog signal.

26. A method of generating an output analog waveform signal, said method comprising the steps of:

generating a sequence of digital numbers;

applying said sequence of digital numbers to a processor to yield a first digital value;

delaying said first digital value to yield a second digital value;

converting said first digital value and said second digital value to analog form to yield a first analog value and a second analog value, respectively; and processing said first analog value and said second analog value so as to generate a raw analog signal having superimposed thereon a pseudo-dither signal, and removing the pseudo-dither signal from the raw analog signal so as to yield the output analog waveform signal which is smoother and more accurate than the combination of said first analog value and said second analog value alone.

27. The method according to claim 26, wherein said step of processing comprises the step of linearly interpolating said first analog value and said second analog value to generate said output analog signal.

28. The method according to claim 26, wherein said step of processing comprises the step of multiplexing said first analog value and said second analog value to generate said output analog signal.

29. The method according to claim 26, wherein the step of removing the pseudo-dither signal includes applying low pass filter means to said raw analog signal.

30. An apparatus for generating an output analog waveform signal, said apparatus comprising:

generating means for generating a sequence of digital numbers;

memory means coupled to said generating means, said memory means operative to yield a first digital value in accordance with said sequence of digital numbers input thereto;

delay means for delaying said first digital value to yield a second digital value;

conversion means for converting said first digital value and said second digital value to analog form to yield a first analog signal and a second analog signal, respectively;

processing means for generating from said first analog signal and said second analog signal a raw analog signal having superimposed thereon a pseudo-dither signal; and filtering means for removing the pseudo-dither signal from the raw analog signal and thereby yield the output analog waveform signal which is smoother and more accurate than the combination of said first analog signal and said second analog signal alone.

31. The apparatus according to claim 30, wherein said processing means comprises means for linearly interpolating said first analog value and said second analog value to generate said output analog signal.

32. The apparatus according to claim 30, wherein said processing means comprises means for multiplexing said first analog value and said second analog value to generate said output analog signal.

33. The apparatus according to claim 30, wherein the processing means includes means for low pass filtering said raw analog signal.

34. A method of generating an output analog waveform signal, said method comprising the steps of:

generating a first sequence of digital numbers;

incrementing said first sequence of digital numbers to yield a second sequence of digital numbers;

multiplexing said first sequence of digital numbers and said second sequence of digital numbers to yield a multiplexer output signal;

applying said multiplexer output signal to a processor to yield a digital output value; and converting said digital output value to analog form to yield a raw analog signal having superimposed thereon a pseudo-dither signal, and removing the pseudo-dither signal from the raw analog signal so as to yield the output analog waveform signal.

35. An apparatus for generating an output analog waveform signal, comprising:

means for generating a first sequence of digital numbers;

means for incrementing said first sequence of digital numbers to yield a second sequence of digital numbers;

multiplexer means for multiplexing said first sequence of digital numbers and said second sequence of digital numbers to yield a multiplexer output signal;

memory means coupled to said multiplexer means, said memory means operative to yield a digital output value in accordance with said multiplexer output signal input thereto;

conversion means for converting said digital output value to a raw analog signal having superimposed thereon a pseudo-dither signal, and filtering means for removing the pseudo-dither signal from the raw analog signal so as to yield the output analog waveform signal.

* * * * *